US010147827B2

(12) United States Patent
Martins et al.

(10) Patent No.: US 10,147,827 B2
(45) Date of Patent: Dec. 4, 2018

(54) THIN FILM SOLAR CELL

(71) Applicant: University Court of the University of St Andrews, St Andrews (GB)

(72) Inventors: Emiliano Rezende Martins, St Andrews (GB); Thomas Fraser Krauss, St Andrews (GB)

(73) Assignee: University Court of the University of St Andrews, St Andrews (GB)

( * ) Notice: Subject to any disclaimer, the term of this patent is extended or adjusted under 35 U.S.C. 154(b) by 0 days.

(21) Appl. No.: 14/350,324

(22) PCT Filed: Oct. 15, 2012

(86) PCT No.: PCT/GB2012/052550
§ 371 (c)(1),
(2) Date: Apr. 7, 2014

(87) PCT Pub. No.: WO2013/061028
PCT Pub. Date: May 2, 2013

(65) Prior Publication Data
US 2014/0251412 A1  Sep. 11, 2014

(30) Foreign Application Priority Data
Oct. 27, 2011 (GB) .................................. 1118602.0

(51) Int. Cl.
*H01L 31/0236* (2006.01)
*G02B 5/18* (2006.01)
*H01L 31/0232* (2014.01)
*H01L 31/052* (2014.01)
*H01L 31/054* (2014.01)

(52) U.S. Cl.
CPC .. *H01L 31/02327* (2013.01); *H01L 31/02363* (2013.01); *H01L 31/052* (2013.01); *H01L 31/0543* (2014.12); *Y02E 10/52* (2013.01)

(58) Field of Classification Search
CPC ...................... G02B 5/1866; H01L 31/02363
See application file for complete search history.

(56) References Cited

U.S. PATENT DOCUMENTS

| 7,998,877 | B1 * | 8/2011 | Chadda | ............ | H01L 31/02363 257/E21.126 |
| 2005/0094277 | A1 * | 5/2005 | Khusnatdinov et al. | ..... | 359/601 |
| 2005/0199279 | A1 * | 9/2005 | Yoshimine et al. | .......... | 136/251 |

(Continued)

FOREIGN PATENT DOCUMENTS

| JP | 2003298086 A | 10/2003 |
| WO | WO 2004/038462 A1 | 5/2004 |

OTHER PUBLICATIONS

Lin, A et al, "Optimization of random diffraction gratings in thin-film solar cells using genetic algorithms", Solar Energy Materials and Solar Cells, vol. 92, p. 1689-1696 (2008).*

(Continued)

*Primary Examiner* — Magali P Slawski
(74) *Attorney, Agent, or Firm* — Alston & Bird LLP

(57) ABSTRACT

A solar cell that has a thin film of active material in which is defined a series or array of diffraction cells, wherein each diffraction unit-cell has a non-periodic series of diffraction features and is adapted to suppress at least one low order diffraction mode.

18 Claims, 9 Drawing Sheets

(56) References Cited

U.S. PATENT DOCUMENTS

| | | | |
|---|---|---|---|
| 2009/0190202 A1* | 7/2009 | Moidu | B32B 38/10 359/291 |
| 2010/0193021 A1 | 8/2010 | Park et al. | |
| 2010/0275976 A1* | 11/2010 | Rubin | H01L 31/02008 136/251 |
| 2010/0294357 A1 | 11/2010 | Hyun | |
| 2011/0203663 A1 | 8/2011 | Prather et al. | |
| 2012/0167983 A1* | 7/2012 | Cho | H01L 31/055 136/257 |
| 2012/0174980 A1* | 7/2012 | Iizuka | H01L 31/02366 136/259 |

OTHER PUBLICATIONS

Dewan, R et al, "Light trapping in thin-film silicon solar cells with integrated diffraction grating", Journal of Applied Physics, vol. 106, p. 074901 (2009).*

Mokkapati, Sudha, F., et al. "Analytical approach for design of blazed dielectric gratings for light trapping in solar cells." Journal of Physics D: Applied Physics 44.5 (2011): 055103.*

Mutitu, James G., et al. "Thin film silicon solar cell design based on photonic crystal and diffractive grating structures." Optics express 16.19 (2008): 15238-15248.*

Eisele, C., "Periodic light coupler gratings in amorphous thin film solar cells." Journal of Applied Physics 89.12 (2001): 7722-7726.*

Catchpole, K., et al "A conceptual model of the diffuse transmittance of lamellar diffraction gratings on solar cells". Journal of Applied Physics, vol. 102. p. 013102 (2007).*

Thorlabs "Optics: Introduction to Diffraction Grating" https://www.thorlabs.com/catalogpages/802.pdf Accessed Feb. 17, 2018 (Year: 2018).*

Intellectual Property Office, Search Report for Application No. GB1118602.0, dated Mar. 9, 2012, 3 pages, United Kingdom.

International Searching Authority, International Search Report and Written Opinion for International Application No. PCT/GB2012/052550, dated Jan. 10, 2013, 10 pages, European Patent Office, The Netherlands.

Sheng, Xing, et al; "Low-Cost, Deterministic Quasi-Periodic Photonic Structures for Light Trapping in Thin Film Silicon Solar Cells", 34$^{th}$ IEEE Photovoltaic Specialists Conference (PVSC), Jun. 2009, pp. 02395-002398, IEEE, USA.

* cited by examiner a)

b)

c)

THIN FILM SOLAR CELL

CROSS REFERENCE TO RELATED APPLICATIONS

This application is a national stage application, filed under 35 U.S.C. § 371, of International Application No. PCT/GB2012/052550, filed Oct. 15, 2012, which claims priority to GB 1118602.0, filed Oct. 27, 2011, the contents of both of which are hereby incorporated by reference in their entirety.

BACKGROUND

Related Field

The present invention relates to a thin film solar cell. In particular, the present invention relates to a thin film solar cell that has one or more diffractive optical supercell structures with the purpose of enhancing light trapping.

Description of Related Art

Solar panels are made of a series of solar cells. These are used to capture sunlight and convert it into electrical power. With the on-going move towards renewable energy, solar panels are becoming of increasing interest to consumers and businesses alike. However, the cost of solar panels is still relatively high and the efficiency relatively low.

To make solar panels more accessible, there has been a drive to reduce costs and improve efficiency. To this end, thin film solar cells are increasingly being used. These devices have an active layer that has a reduced thickness. This means that processing and material costs are reduced, while the overall device efficiency can be maintained. To maintain the efficiency of thin film devices, light trapping structures are used to effectively couple light into guided modes of the thin film, thus facilitating efficient absorption.

Recent work has shown that the use of diffractive optical structures provides a promising light trapping technique for thin-film solar cells. Diffractive structures or gratings can be used to excite quasi-guided modes in the absorbing film, providing strong absorption enhancement at the resonant wavelength. As an example, a simple grating has been used in a solar cell to act as a surface coupler. The grating has a period corresponding to the wavelength of light, i.e. 500-1000 nm for silicon-based solar cell applications. Such a grating relies on few diffraction orders, mainly the first, to couple light into the thin film. This gives a very narrow-band and strongly angle-dependent enhancement, so only a limited scope for light trapping.

To increase the bandwidth and the number of angles that can be coupled into guided modes, a larger period grating can be used. In this case, higher orders of the grating are used to excite multiple modes in the thin film. Simple gratings diffract most of the energy into the first diffracted order. However, this cannot excite a guided mode if the period is larger than the wavelength. Hence, most of the incoming power is lost and not successfully diffracted into a guided mode.

BRIEF SUMMARY

According to the present invention, there is provided a solar cell that has a thin film of active material on which is defined a periodic series of diffraction cells, wherein each diffraction cell has a non-periodic series of diffraction features and is adapted to suppress at least one low order diffraction mode.

By designing each diffraction cell to suppress lower order diffraction modes, which generally cannot be coupled into the thin film, more energy is transferred into the higher order modes, which can couple into the thin film. This allows multi-mode coupling, and maximises the excitation of guided modes into the thin film.

Typically, the period of the diffraction cells is two or more optical wavelengths, at the wavelength of interest. Preferably, the period is three to five optical wavelengths.

Preferably, the first order mode is suppressed. In addition, the second order mode may be suppressed. Further higher order modes may be suppressed, for example the third and optionally the fourth mode.

The diffraction cells may be provided in a one dimensional array. Alternatively, the diffraction cells may be provided in a two dimensional array.

The diffraction cells may all be the same.

The thin film of active material may have a thickness in the range of 100 nm to 100 μm, the range between 100 nm and 1 μm being the most promising, depending on material.

The thin film of active material may comprise silicon, but the method can also be successfully applied to other materials such CdTe, CIGS and the different forms of silicon, such as amorphous, microcrystalline and single crystalline silicon.

According to a second aspect of the present invention, there is provided a solar panel that includes a plurality of solar cells according to the first aspect of the invention.

According to yet another aspect of the invention, there is provided a solar panel system that includes a plurality of solar panels according to the second aspect of the invention.

BRIEF DESCRIPTION OF THE FIGURES

Various aspects of the invention will now be described by way of example only and with reference to the accompanying drawings, of which.

DETAILED DESCRIPTION OF VARIOUS EMBODIMENTS

FIG. 1(a) shows a supercell based solar cell and FIG. 1(b) shows a conventional grating based solar cell.

The supercell solar cell of FIG. 1(a) has a thin film of active material, for example silicon, on the surface of which is defined a series of supercells, which form a series of non-periodic steps in the external surface of the solar cell. Each supercell has non-periodic features, in this case simple line features. In the example shown, the width of the line features within each supercell is different. In addition, the spacing between the line features is different. The period of the supercell is a multiple of the target wavelength (typically 3-5 wavelengths).

The solar cell of FIG. 1(b) has a thin film of active material, for example silicon, on the surface of which is defined a conventional periodic diffraction grating. In this case, the line features of the grating are all of the same width and the spacing between each line feature is the same.

The supercell grating is designed to couple higher diffracted orders into guided modes and to suppress modes that cannot be coupled, typically the first and second order modes. As a rule of thumb, if the supercell is m wavelengths long, then the m-th and higher diffracted orders couple into a guided mode while the m–1$^{st}$ and lower order modes are diffracted into air, so need to be suppressed. For example, for a wavelength of λ=600 nm and m=3, the supercell would be a=1800 nm long, and the fine structure would be designed to suppress the 1st and 2nd diffracted order while enhancing the third and higher orders.

The supercell of FIG. 1(a) is designed to suppress the first and second order modes. The Fourier series for the cell of FIG. 1(a) is illustrated in the graph on the right hand side of FIG. 1(a). From this, it can be seen that the first and second orders are substantially suppressed, and most of the incident energy is in the third and fourth diffraction orders. In contrast, for the conventional grating of FIG. 1(b), much of the incident energy is transferred into the first and second diffracted orders.

Figure 2:
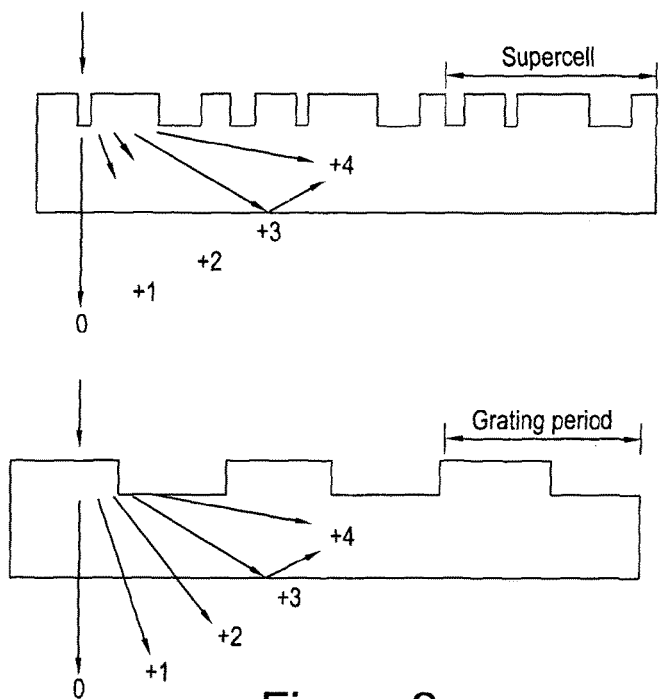
FIG. 2(a) is a cross section through the solar cell of FIG. 1(a), in which light coupling into the thin film is shown.
FIG. 2(b) is a cross section through the solar cell of FIG. 1(b), in which light coupling into the thin film is shown.

FIG. 2 illustrates the difference in coupling between the different diffracted orders in case of the supercell grating and the regular grating. This shows the advantages of suppressing the lower diffraction orders, which do not couple into the thin film. By ensuring that as much energy as possible is transferred into the higher diffraction orders, coupling efficiency for the supercell solar cell is better than for the simple grating, where the lower diffractions orders that do not couple into the thin film have relatively high energies.

Figure 1:
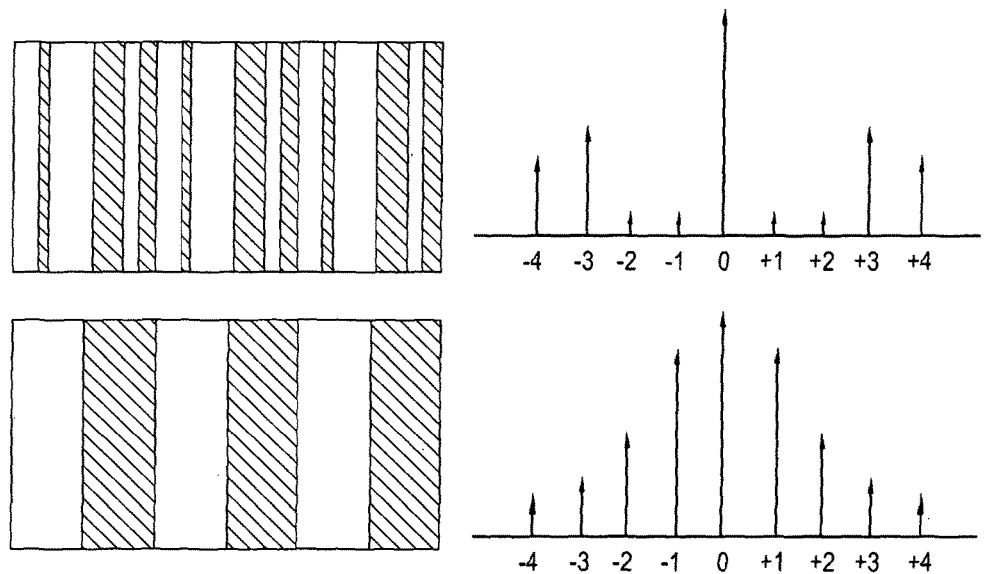
FIG. 1(a) is a plan view of a solar cell with a diffractive optical supercell.
FIG. 1(b) is a plan view of a solar cell with conventional periodic gratings.

For the sake of completeness, it should be noted that in the example of FIG. 1, and indeed all of the supercell solar cells described herein, the zero order exhibits the highest amplitude. This order is not affected by the supercell geometry. Hence, it needs to be suppressed by a separate optimisation involving the depth and fill-factor of the grating. Techniques for doing this are known in the art and are not the subject of the present invention.

Figure 3:
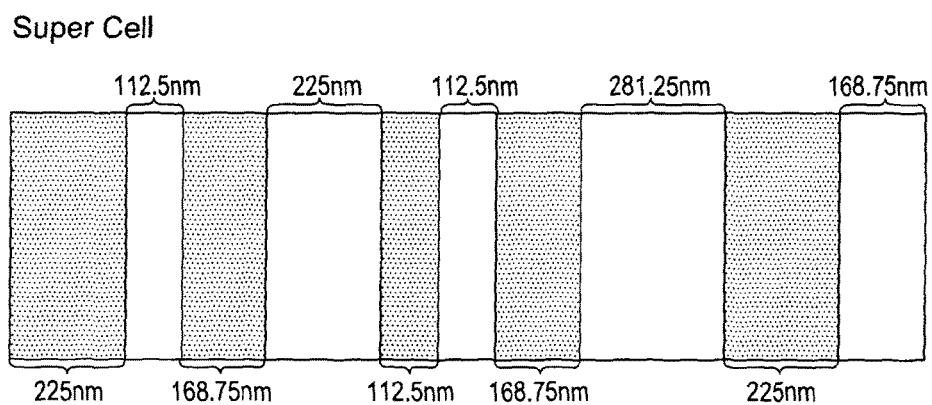
FIG. 3 is a plan view of a supercell solar cell that is specifically designed to suppress the first and second diffraction orders.
Figure 4:
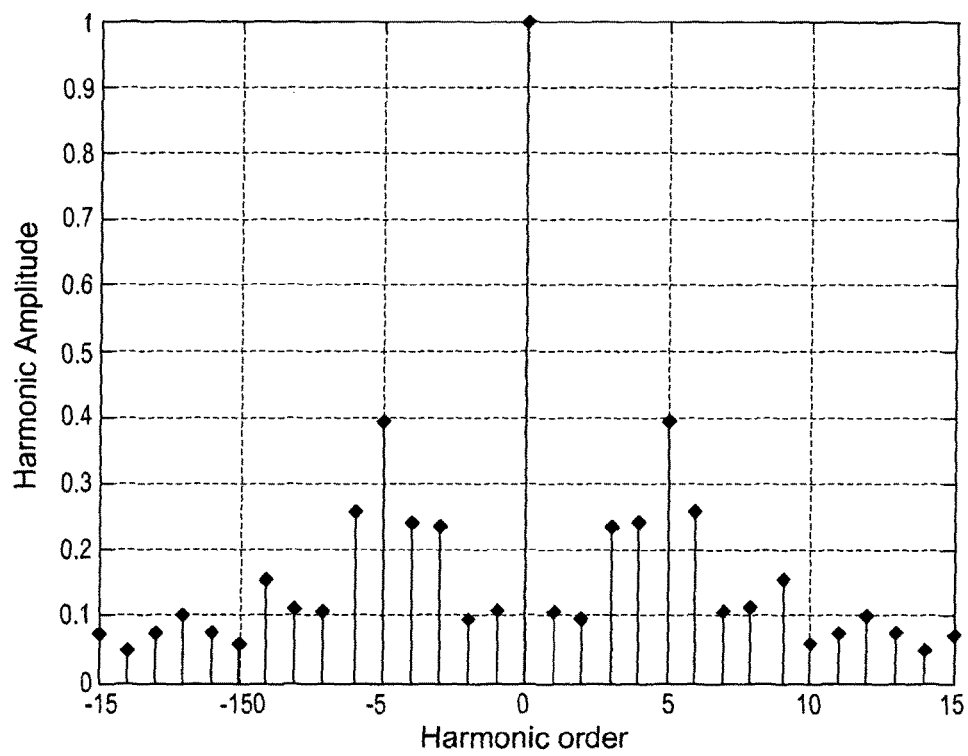
FIG. 4 shows the Fourier series for the cell of FIG. 3.

FIG. 3 shows an example of a supercell that is designed to suppress the first two diffraction orders for enhancing absorption on a thin-film crystalline silicon solar cell, typically 400 nm thick. The absorbing region spans the wavelength range from 300 nm to 1.2 μm and the grating is designed to trap light mainly in the region between 500 nm and 1.2 μm, where the absorption length is much larger than the material thickness. This supercell has a period of 1.8 μm. This means that the first two diffracted orders contribute to diffraction into air. Following the design rule, these diffracting orders are suppressed by the supercell. FIG. 4 shows the Fourier series of the supercell of FIG. 3.

Suppression of the first and second orders is caused by interference. The supercell Fourier series comprises multiple top-hat functions Fourier series. Because each top-hat function is displaced in space from each order, their Fourier series are phase shifted by a factor of exp(i2πna/ ). Here, i is the pure complex number, n is the order number, a is the displacement length and is the period. Since this phase shift depends on the order number, it is possible to get constructive interference for higher orders and destructive interference for the lower orders when multiple top-hat functions are added together. By suitably designing the supercell, it is possible to ensure that the lower diffraction orders destructively interfere and so are suppressed.

Figure 5:
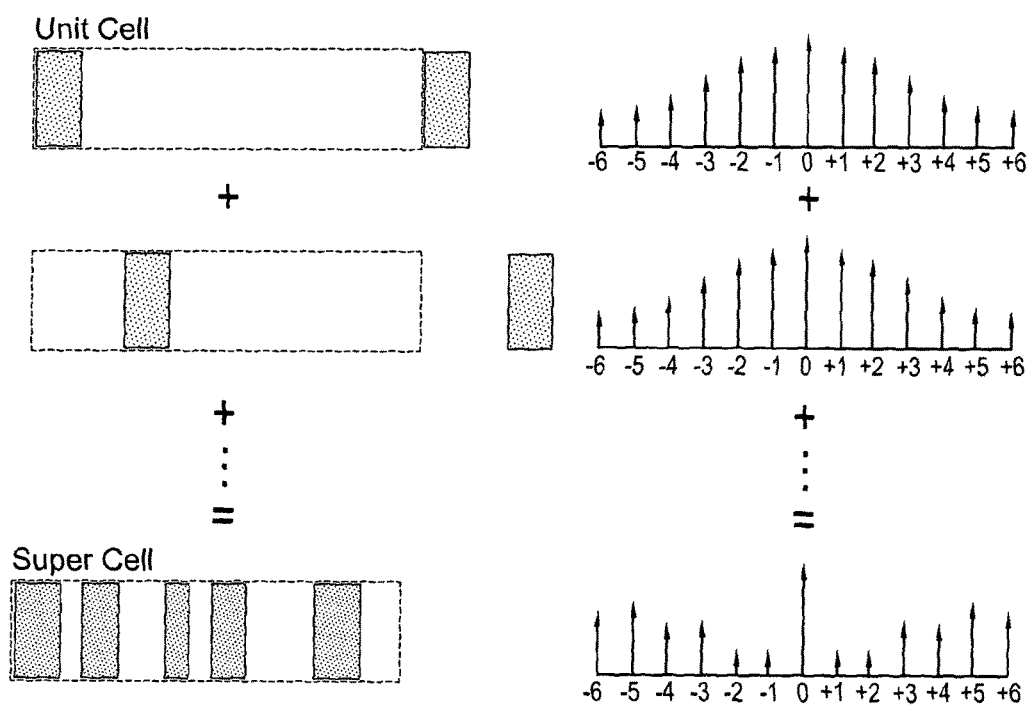
FIG. 5 illustrates the design principle of a supercell grating that consists of a superposition of multiple low filling factor gratings with the same period, where the gratings are spatially offset from one another.

To design the cell the Fourier spectrum of the grating is tailored. This process is illustrated in FIG. 5 and is based on the well-known property of the Fourier series that a spatial shift of the function induces a phase shift of the Fourier series, as shown in equation 1:

$$f(x - x_0) \Leftrightarrow F(m)\exp\left(-i\frac{2\pi}{a}mx_0\right) \quad \text{(equation 1)}$$

where F(m) is the Fourier series of f(x), m is an integer corresponding to the diffraction order, a is the period, and $x_0$ is the spatial translation. Since the phase shift depends on $x_0$ and on m, the spatial shift can be chosen to provide destructive interference for lower orders and constructive interference for higher orders. In this example, the aim is to couple light mainly in the wavelength region above 600 nm, because this is the spectral region where the absorption in silicon is very low.

Once the wavelength region of interest is defined, the highest diffractive order is given by the ratio between the period and the wavelength. As an example, the period is selected to be 1800 nm, which gives a ratio of 3; i.e., the m=3 order couples into air for λ<600 nm, and only into the slab for λ>600 nm, while orders 1 and 2 always diffract into air and must therefore be suppressed. The next step is to superimpose multiple gratings in order to reduce orders 1 and 2. The selection of the required spatial shifts is done using a simple binary search. In the binary search, an array of pixels is defined. Pixels defined as 1 represent ridges and pixels defined as 0 represent grooves. The pixel size is arbitrary, and so the fabrication limitations were chosen as the constraint criteria, i.e. 112 nm. Therefore, there are 32 pixels for the chosen period of 1800 nm, with a minimum block size of 2 pixels.

A binary search is performed by swapping the value of each pixel and calculating the Fourier transform of the total pixel array each time a pixel is changed. The resulting supercell consists of 10 blocks, with the following sequence of number of pixels: 4, 2, 3, 4, 2, 2, 3, 5, 4, 3. This sequence, with bold representing ridges, is shown schematically in FIG. 5.

The performance of the supercell can be compared to conventional sub-wavelength gratings using the Rigorous Coupled Wave Analysis (RCWA), which is a standard semi-analytical method to calculate diffraction problems. As an example, the performance of an optimised simple sub-wavelength grating (with 600 nm period) was compared to the supercell shown in FIG. 3. For the purposes of the calculations, it was assumed that the silicon slab was 400 nm thick. The integrated absorption was calculated assuming the solar photon density. The enhancement factor is a measure of the total absorption relative to an un-patterned slab.

Figure 6:
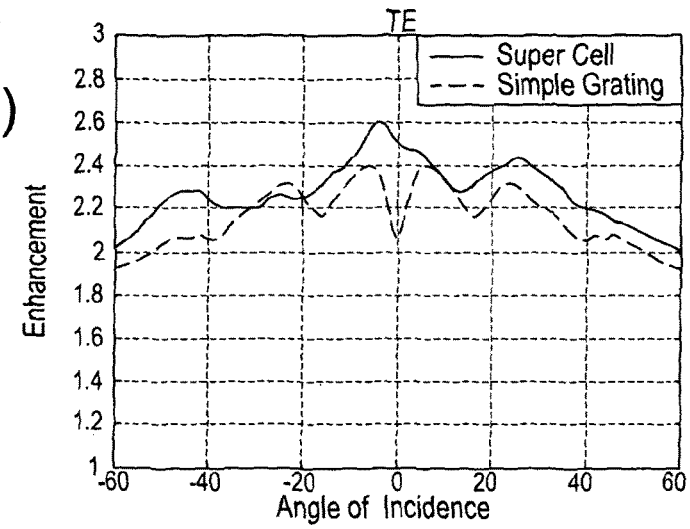
FIGS. 6(a) to (c) show a comparison between the performances of a conventional subwavelength grating and a super cell.
Figure 6:
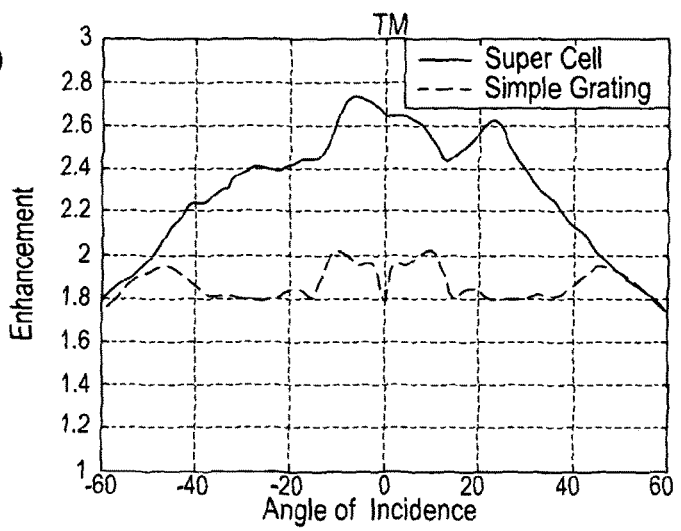
Figure 6:
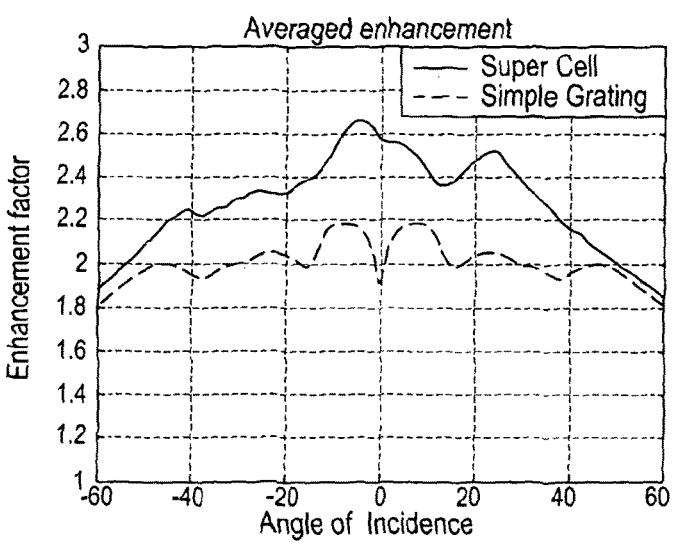

FIG. 6 shows comparative simulations for a supercell based solar cell and a simple grating. FIG. 6 (*a*) shows calculated enhancement over un-patterned slab for TE polarization for both a super cell solar cell and a simple grating. FIG. 6 (*b*) shows calculated enhancement over un-patterned slab for TM polarization for both a super cell solar cell and a simple grating. FIG. 6 (*c*) shows calculated enhancement over un-patterned slab for un-polarized light for both a super cell solar cell and a simple grating. As can be seen in FIG. 6, the supercell outperforms the subwavelength grating over a wide range of incidence angles. This is advantageous for solar cell applications.

Figure 7:
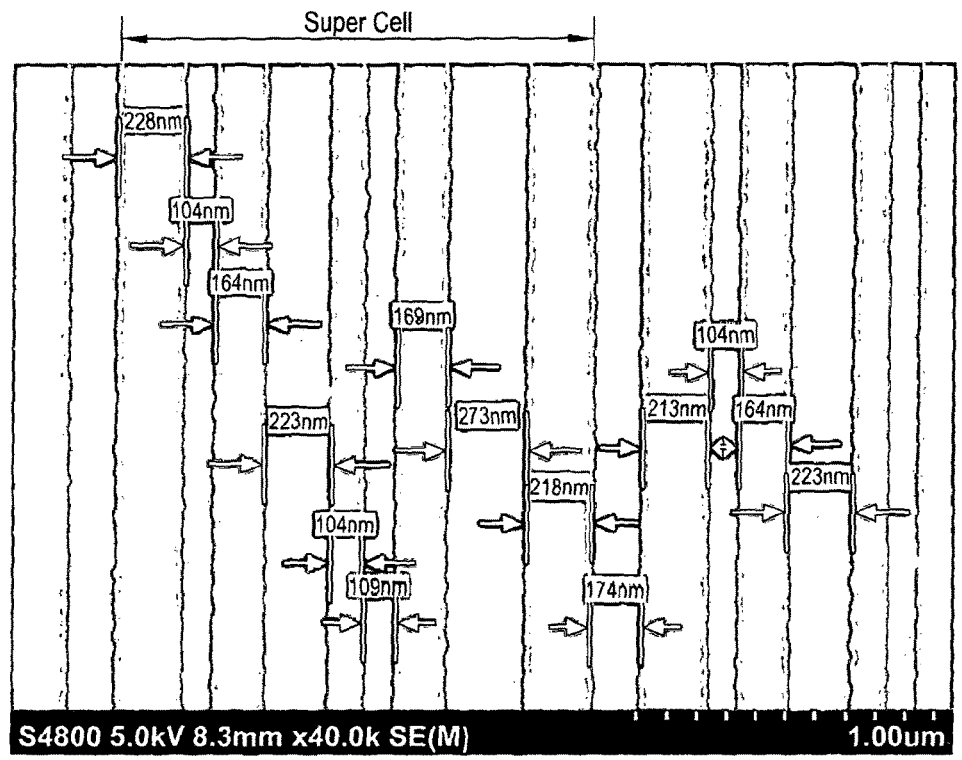
FIG. 7 is a Scanning Electron Microscope (SEM) image of a supercell that was fabricated in Silicon On Insulator (SOI) material.
Figure 8:
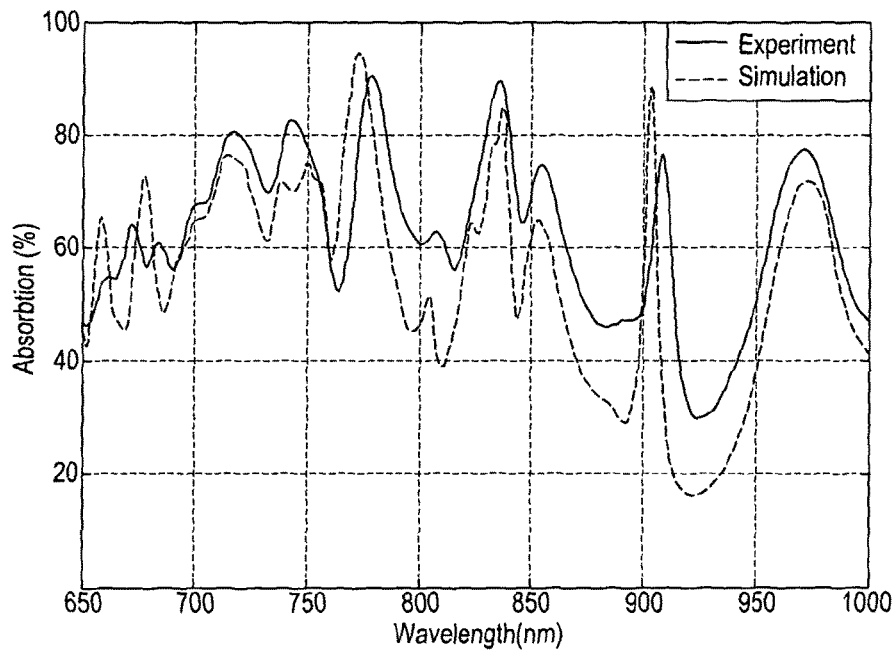
FIG. 8 is a plot of absorption versus wavelength for experimental data and calculated data for a SOI wafer with supercell gratings.

FIG. 7 shows a Scanning Electron Microscope (SEM) image of a supercell that was fabricated in a Silicon On Insulator (SOI) wafer, which has 220 nm of silicon on top of 2 μm silicon dioxide, sitting on a 500 μm substrate. The absorption of the SOI with the grating on the top was measured. The contribution of the grating is seen as resonances in the absorption spectrum. FIG. 8 shows a comparison between experimental and calculated absorption on a SOI wafer with the supercell gratings. As can be seen from this, there is a very good match between the experiment and the calculations.

Figure 9:
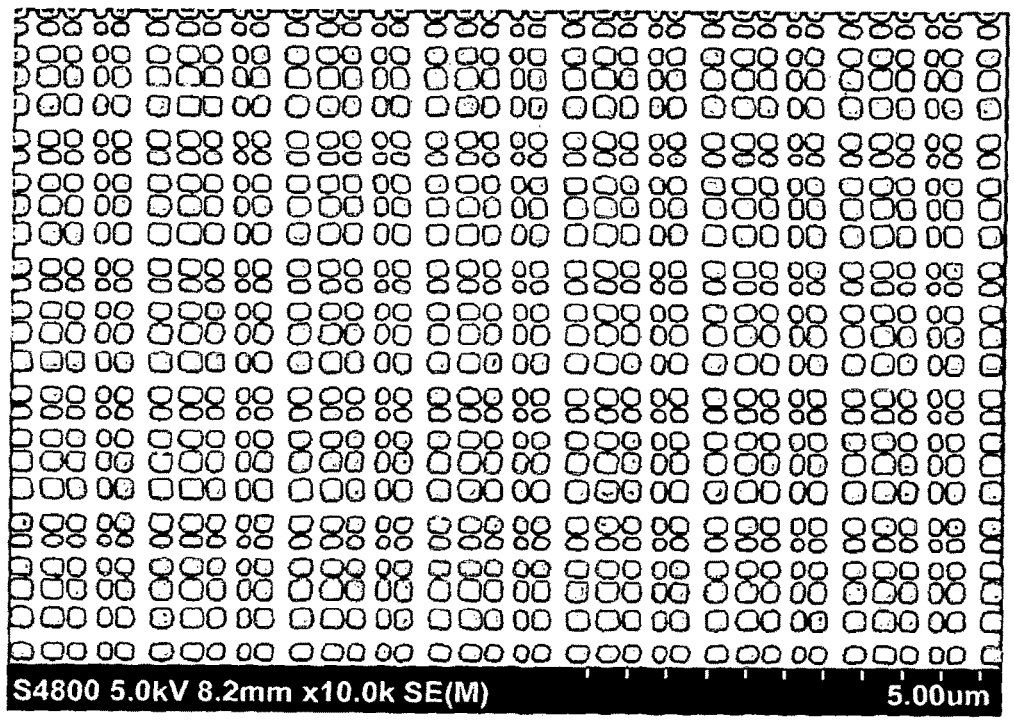
FIG. 9 is a plan view of a fabricated 2D supercell.
Figure 10:
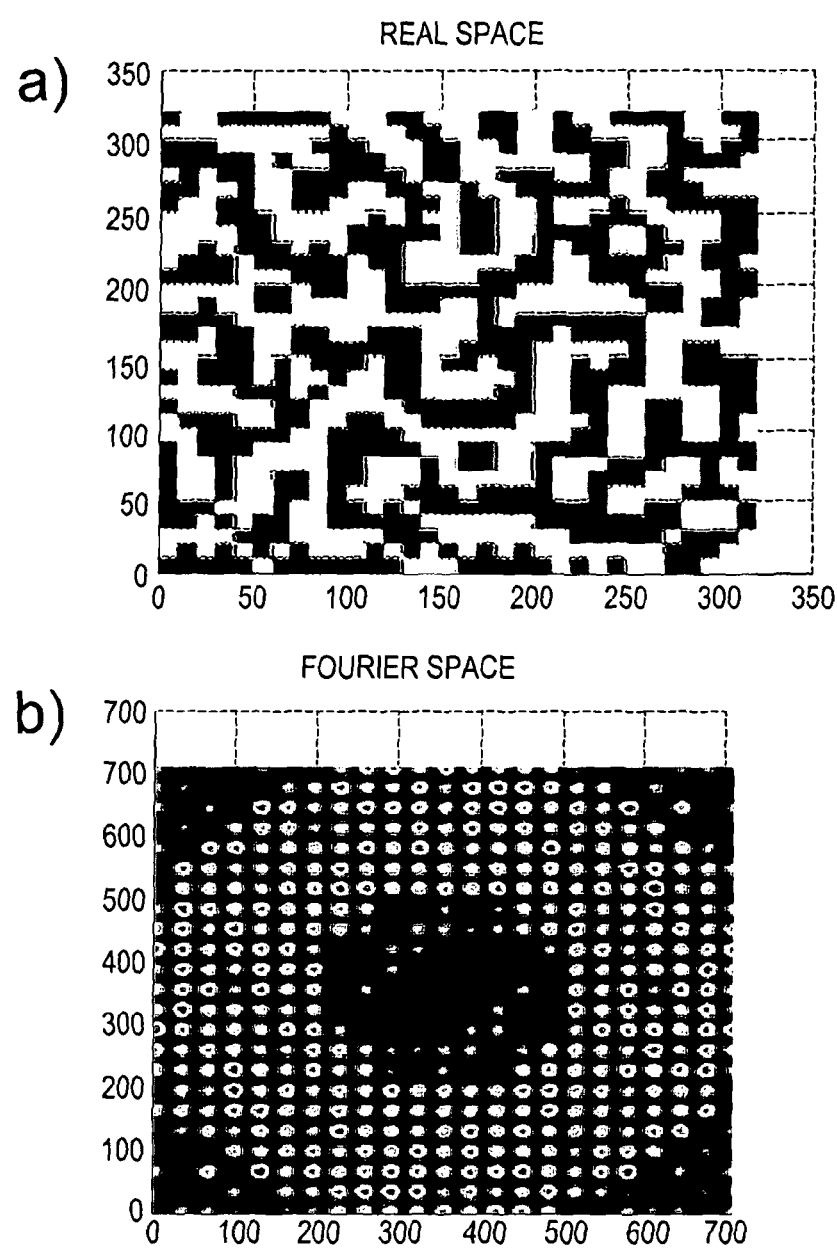
FIG. 10 shows a plan view of a 2-D supercell lattice on a thin film solar cell (a), and the corresponding diffraction orders (b), also known as Fourier components.

The supercell concept can be extended to 2-D structures. An example of a fabricated 2D supercell is shown in FIG. 9. This 2D supercell is achieved by simply repeating the 1D supercell of FIG. 7 in the x and y directions. Another option is to create a superlattice that suppresses low diffraction orders, as is shown in FIG. 10. FIG. 10(*a*) shows a superlattice and FIG. 10(*b*) shows the corresponding Fourier components of the superlattice showing suppressed low diffraction orders. In this case, the 2D structure was created using a numerical optimisation routine based on the concepts described above. The benefits of the supercell approach are higher in the 2D case than in the 1D case, as 2-D patterning allows control of more degrees of freedom. Numerical simulations have shown that the 2D supercell can substantially outperform standard 2D gratings.

Figure 11:
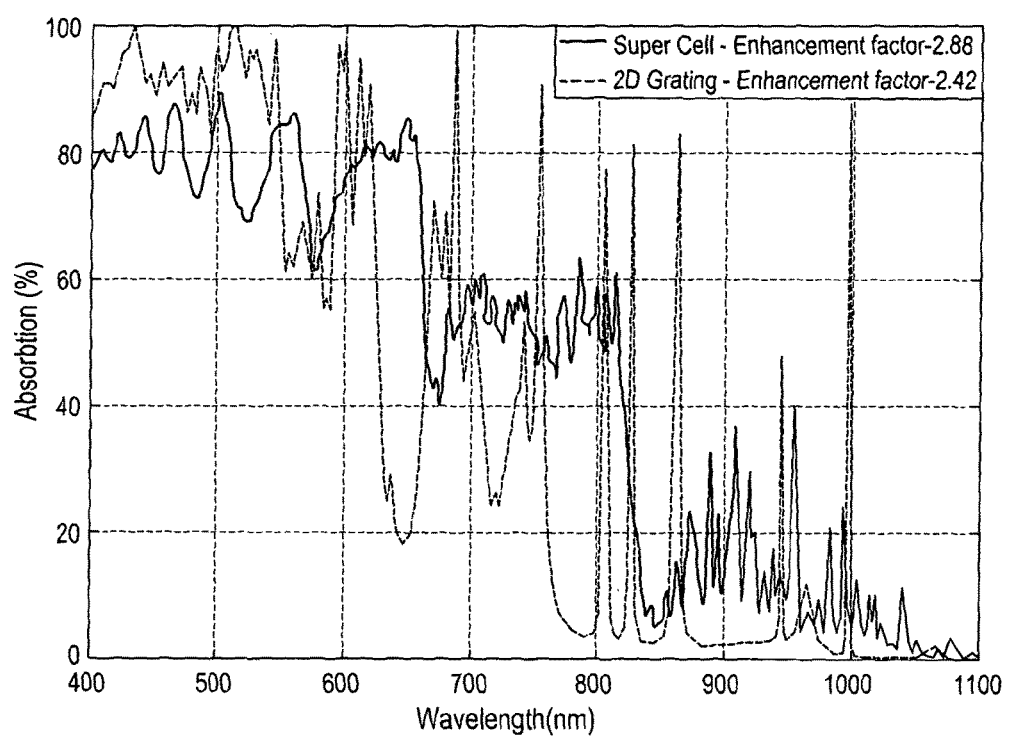
FIG. 11 shows an absorption spectrum for a supercell and an absorption spectrum for a standard 2D grating with an optimised period of 350 nm.

FIG. 11 shows an absorption spectrum for a supercell and an absorption spectrum using a standard 2D grating with an optimised period of 350 nm. As is clear from the spectra, the supercell can excite much more resonances than the standard grating, resulting in a 46% efficiency enhancement. Numerical simulations also show that the supercell is capable of providing, in a 400 nm thick silicon slab, the same integrated absorption that a standard optimised 2D grating can provide in a 1um thick slab. Therefore, the supercell is capable of reducing the cost associated with more than half of the absorbing slab thickness.

Figure 12:
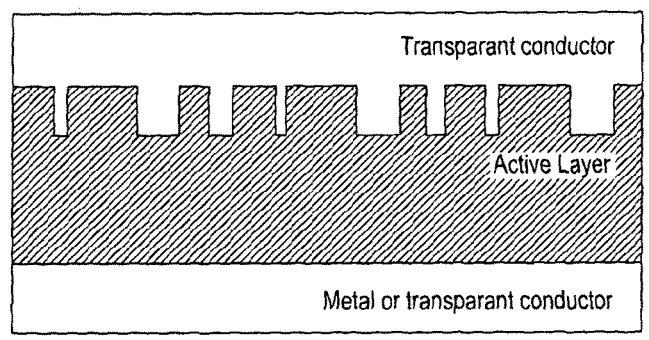
FIG. 12 is a cross section through another example of supercell solar cell.

FIG. 12 shows a solar cell that includes the diffractive supercells of the invention. In this case, the supercell grating is provided in the interface between an externally facing transparent conductor and the active layer. To make the cell of FIG. 12, the active layer may be patterned on an upper surface and coated with a layer that is transparent to light. The rear surface of the active layer is coated with a metal or another conductive layer. Optionally, the rear surface is also transparent. Alternatively, an upper substrate is first patterned and then coated with a transparent layer. In this case, the pattern is automatically transferred to the transparent conductor. Finally the active layer is deposited. Another option is to pattern the transparent conductor and then deposit the active layer.

Figure 13:
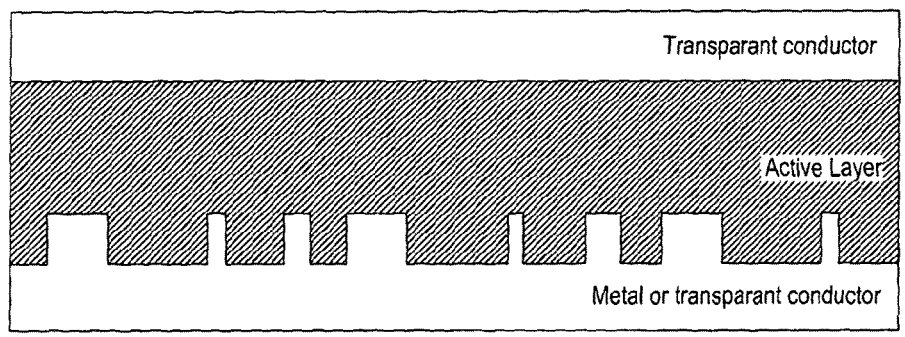
FIG. 13 is a cross section through yet another example of supercell solar cell.

FIG. 13 shows an alternative arrangement. In this case, the interface between the active layer and the externally facing transparent layer is substantially flat, and the diffractive supercell grating is provided at the interface between the rear conductor and the active layer. In this example, the structure may be made starting from the transparent conductor, then the active layer is deposited and patterned, and finally the metal on the rear surface is deposited. Another option would be to start from the metal on the rear surface, pattern it, then deposit the active layer and finally deposit the transparent conductor.

The present invention provides a simple and effective solution to the technical problem of how to maximise coupling efficiency in thin film solar cells. Advantageously, the thin film solar cells of the present invention can be manufactured using conventional semiconductor processing techniques, for example photolithography, nanoimprint litography and etching to form the diffractive optical structures.

A skilled person will appreciate that variations of the disclosed arrangements are possible without departing from the invention. For example, although the solar cells described above have periodic arrays of supercells, this is not essential, and the supercells may be non-periodically spaced, provided the overall arrangement and interaction of the supercells is such as to suppress at least one low order diffraction mode. Accordingly, the above description of the specific embodiment is made by way of example only and not for the purposes of limitation. It will be clear to the skilled person that minor modifications may be made without significant changes to the operation described.

The invention claimed is:

1. A solar cell for coupling light having a wavelength in a wavelength range of interest, said solar cell comprising:
   a thin film of active material; and
   at least one of a series or an array of diffraction cells defined in the thin film of active material, each of the diffraction cells in the series or the array being substantially identical relative to one another,
   wherein:
      each diffraction cell has a non-periodic series of diffraction features provided at a surface of the thin film of active material, the non-periodic series of diffraction features is non-periodic in at least one of a width or a spacing of the diffraction features such that at least one of:
         (i) the widths of at least three diffraction features of the non-periodic series are different; or
         (ii) the spacings between each immediately adjacent diffraction feature within at least three diffraction features of the non-periodic series are different;
      each diffraction cell is configured to:
         for said light having said wavelength, suppress only a first order diffraction mode, only a combination of the first order diffraction mode and a second order diffraction mode, or only a combination of the first diffraction mode, the second order diffraction mode, and a third order diffraction mode; and
         for said light having said wavelength, transfer energy from one or more of the suppressed diffraction modes to one or more higher order diffraction modes that are guided within the thin film, so as to enhance at least one of the one or more higher order diffraction modes.

2. A solar cell as claimed in claim 1, wherein the diffraction cells in the series or array are periodically arranged.

3. A solar cell as claimed in claim 2, wherein the period of the diffraction cells is two or more optical wavelengths, at the wavelength.

4. A solar cell as claimed in claim 3, wherein the period of the diffraction cells is three to five optical wavelengths.

5. A solar cell as claimed in claim 1, wherein only the first order diffraction mode is suppressed.

6. A solar cell as claimed in claim 1, wherein only the first and the second order diffraction modes are suppressed.

7. A solar cell as claimed in claim 1, wherein only the first, second, and third order diffraction modes are suppressed.

8. A solar cell as claimed in claim 1, wherein the diffraction cells are provided in a one dimensional array.

9. A solar cell as claimed in claim 1, wherein the diffraction cells are provided in a two dimensional array.

10. A solar cell as claimed in claim 1, wherein the thin film of active material has a thickness in the range of 100 nm to 100 μm.

11. A solar cell as claimed in claim 10, wherein the thickness is in the range of 100 nm to 1 μm.

12. A solar cell as claimed in claim 1, wherein the thin film of active material comprises a silicon material.

13. A solar cell as claimed in claim 1, wherein the thin film of active material is at least one of: an amorphous silicon, a microcrystalline silicon, a single crystalline silicon, a CdTe, or a CIGS.

14. A solar cell as claimed in claim 1, wherein the diffraction cells are formed on at least one of a front or a rear surface of the active material.

15. A solar cell as claimed in claim 1, wherein a transparent layer is deposited on a front surface of the active material.

16. A solar cell as claimed in claim 1, wherein a conductive layer is deposited on a rear surface of the active material.

17. A solar panel that includes a plurality of solar cells according to claim 1.

18. A solar panel system that includes a plurality of solar panels, each according to claim 17.

* * * * *